(12) United States Patent
Bytheway et al.

(10) Patent No.: US 8,910,104 B2
(45) Date of Patent: Dec. 9, 2014

(54) GRADUATED ROUTING FOR ROUTING ELECTRODES COUPLED TO TOUCH SENSOR ELECTRODES TO THEREBY BALANCE CAPACITANCE ON THE TOUCH SENSOR ELECTRODES

(71) Applicant: Cirque Corporation, Salt Lake City, UT (US)

(72) Inventors: Jared G. Bytheway, Sandy, UT (US); Jon Alan Bertrand, Taylorsville, UT (US)

(73) Assignee: Cirque Corporation, Salt Lake City, UT (US)

( * ) Notice: Subject to any disclaimer, the term of this patent is extended or adjusted under 35 U.S.C. 154(b) by 0 days.

(21) Appl. No.: 13/748,400

(22) Filed: Jan. 23, 2013

(65) Prior Publication Data

US 2013/0191804 A1    Jul. 25, 2013

Related U.S. Application Data

(60) Provisional application No. 61/589,735, filed on Jan. 23, 2012.

(51) Int. Cl.
*G06F 17/50* (2006.01)

(52) U.S. Cl.
CPC .................................. *G06F 17/5077* (2013.01)
USPC ......................................................... 716/126

(58) Field of Classification Search
CPC ............ G06F 17/5077; G06F 17/5068; G06F 17/5072; G06F 17/5054; H05K 3/0005
USPC ......................................................... 716/126
See application file for complete search history.

(56) References Cited

U.S. PATENT DOCUMENTS

| | | | | |
|---|---|---|---|---|
| 7,382,139 | B2 * | 6/2008 | Mackey .......................... | 324/660 |
| 7,688,080 | B2 * | 3/2010 | Golovchenko et al. ........ | 324/660 |
| 7,926,728 | B2 * | 4/2011 | Raggam et al. ................ | 235/492 |
| 8,456,443 | B2 * | 6/2013 | Bulea et al. .................... | 345/174 |
| 8,581,866 | B2 * | 11/2013 | Park et al. ...................... | 345/173 |
| 2004/0068709 | A1 * | 4/2004 | Hojat et al. ...................... | 716/10 |
| 2007/0074914 | A1 * | 4/2007 | Geaghan et al. ............ | 178/18.06 |
| 2011/0279409 | A1 * | 11/2011 | Salaverry et al. ............. | 345/174 |

* cited by examiner

*Primary Examiner* — Thuan Do
*Assistant Examiner* — Magid Dimyan
(74) *Attorney, Agent, or Firm* — Morriss O'Bryant Compagni, PC

(57) ABSTRACT

A system and method for balancing the capacitive charge on touch sensor electrodes so that every two adjacent routes have the same capacitance as any other adjacent two routes, wherein routing electrodes are spaced further and further apart, or graduated, as they get longer, to thereby balance the capacitance on the touch sensor electrodes without having to add or subtract an offset from each touch sensor electrode.

15 Claims, 8 Drawing Sheets

GRADUATED ROUTING FOR ROUTING ELECTRODES COUPLED TO TOUCH SENSOR ELECTRODES TO THEREBY BALANCE CAPACITANCE ON THE TOUCH SENSOR ELECTRODES

CROSS REFERENCE TO RELATED APPLICATIONS

This document claims priority to and incorporates by reference all of the subject matter included in the provisional patent application having Ser. No. 61/589,735, and filed Jan. 23, 2012.

BACKGROUND OF THE INVENTION

1. Field of the Invention

This invention relates generally to touch sensors including touchpads and touchscreens. More specifically, the present invention is a method of balancing capacitance on the electrodes to improve performance.

2. Description of Related Art

There are several designs for capacitance sensitive touch sensors. It is useful to examine the underlying technology to better understand how any capacitance sensitive touch sensor can be modified to work with the present invention.

The CIRQUE® Corporation touchpad is a mutual capacitance-sensing device and an example is illustrated as a block diagram in FIG. 1. In this touchpad 10, a grid of X (12) and Y (14) electrodes and a sense electrode 16 is used to define the touch-sensitive area 18 of the touchpad. Typically, the touchpad 10 is a rectangular grid of approximately 16 by 12 electrodes, or 8 by 6 electrodes when there are space constraints. Interlaced with these X (12) and Y (14) (or row and column) electrodes is a single sense electrode 16. All position measurements are made through the sense electrode 16.

The CIRQUE® Corporation touchpad 10 measures an imbalance in electrical charge on the sense line 16. When no pointing object is on or in proximity to the touchpad 10, the touchpad circuitry 20 is in a balanced state, and there is no charge imbalance on the sense line 16. When a pointing object creates imbalance because of capacitive coupling when the object approaches or touches a touch surface (the sensing area 18 of the touchpad 10), a change in capacitance occurs on the electrodes 12, 14. What is measured is the change in capacitance, but not the absolute capacitance value on the electrodes 12, 14. The touchpad 10 determines the change in capacitance by measuring the amount of charge that must be injected onto the sense line 16 to reestablish or regain balance of charge on the sense line.

The system above is utilized to determine the position of a finger on or in proximity to a touchpad 10 as follows. This example describes row electrodes 12, and is repeated in the same manner for the column electrodes 14. The values obtained from the row and column electrode measurements determine an intersection which is the centroid of the pointing object on or in proximity to the touchpad 10.

In the first step, a first set of row electrodes 12 are driven with a first signal from P, N generator 22, and a different but adjacent second set of row electrodes are driven with a second signal from the P, N generator. The touchpad circuitry 20 obtains a value from the sense line 16 using a mutual capacitance measuring device 26 that indicates which row electrode is closest to the pointing object. However, the touchpad circuitry 20 under the control of some microcontroller 28 cannot yet determine on which side of the row electrode the pointing object is located, nor can the touchpad circuitry 20 determine just how far the pointing object is located away from the electrode. Thus, the system shifts by one electrode the group of electrodes 12 to be driven. In other words, the electrode on one side of the group is added, while the electrode on the opposite side of the group is no longer driven. The new group is then driven by the P, N generator 22 and a second measurement of the sense line 16 is taken.

From these two measurements, it is possible to determine on which side of the row electrode the pointing object is located, and how far away. Pointing object position determination is then performed by using an equation that compares the magnitude of the two signals measured.

The sensitivity or resolution of the CIRQUE® Corporation touchpad is much higher than the 16 by 12 grid of row and column electrodes implies. The resolution is typically on the order of 960 counts per inch, or greater. The exact resolution is determined by the sensitivity of the components, the spacing between the electrodes 12, 14 on the same rows and columns, and other factors that are not material to the present invention.

The process above is repeated for the Y or column electrodes 14 using a P, N generator 24

Although the CIRQUE® touchpad described above uses a grid of X and Y electrodes 12, 14 and a separate and single sense electrode 16, the sense electrode can actually be the X or Y electrodes 12, 14 by using multiplexing.

With this background in touch sensor technology, it is possible to analyze the improvement provided by the present invention.

BRIEF SUMMARY OF THE INVENTION

In a preferred embodiment, the present invention is a system and method for balancing the capacitive charge on touch sensor electrodes so that every two adjacent routes have the same capacitance as any other adjacent two routes, wherein routing electrodes are spaced further and further apart, or graduated, as they get longer, to thereby balance the capacitance on the touch sensor electrodes without having to add or subtract an offset.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

It should also be understood that the term "touch sensor" may be used interchangeable with the terms touchpad, touchscreen, trackpad, touch panel, touch input device and touch sensitive device throughout this document.

Traditional projected mutual capacitance touch sensors may have significant offset from one side of the touch sensor to the other due to variations in the routing lengths and spacing between the electrodes. In other words, there can be differences in the amount of charge on sense and drive electrodes when they are supposed to be balanced, simply because of variations in length from one electrode to the next. To account for these differences in charge and capacitance, a touch sensor circuit can able to provide an offset that will compensate for this natural charge imbalance. In other words, a small amount of charge may be introduced onto various electrodes in order to achieve a balanced charge on each electrode.

Creating offsets for each of the electrodes may introduce complexity into circuit design and may require more circuitry and power. Therefore it would be advantageous to provide a circuit design that inherently compensates for a substantial amount of the differences in electrical charge that may naturally occur on the electrodes. It should also be understood that the electrodes referred to in this document may be drive or sense electrodes as those terms are understood by those skilled in the art.

In a multi-layer touch sensor, all the electrodes on one layer may be drive electrodes and all the electrodes on another layer may be sense electrodes. The functions of the electrodes may also be changed. For example, in some embodiments, the function of the electrodes in each layer may be switched between drive and sense functions.

Figure 1:
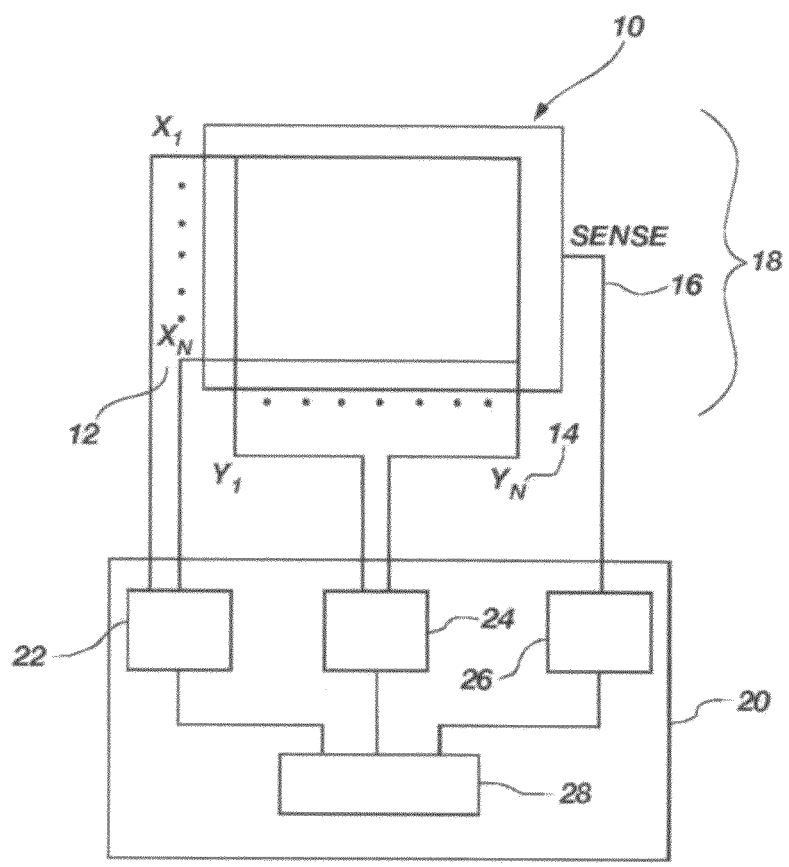
FIG. 1 is a block diagram of the components of a capacitance-sensitive touchpad as made by CIRQUE® Corporation and which can be operated in accordance with the principles of the present invention.
Figure 2:
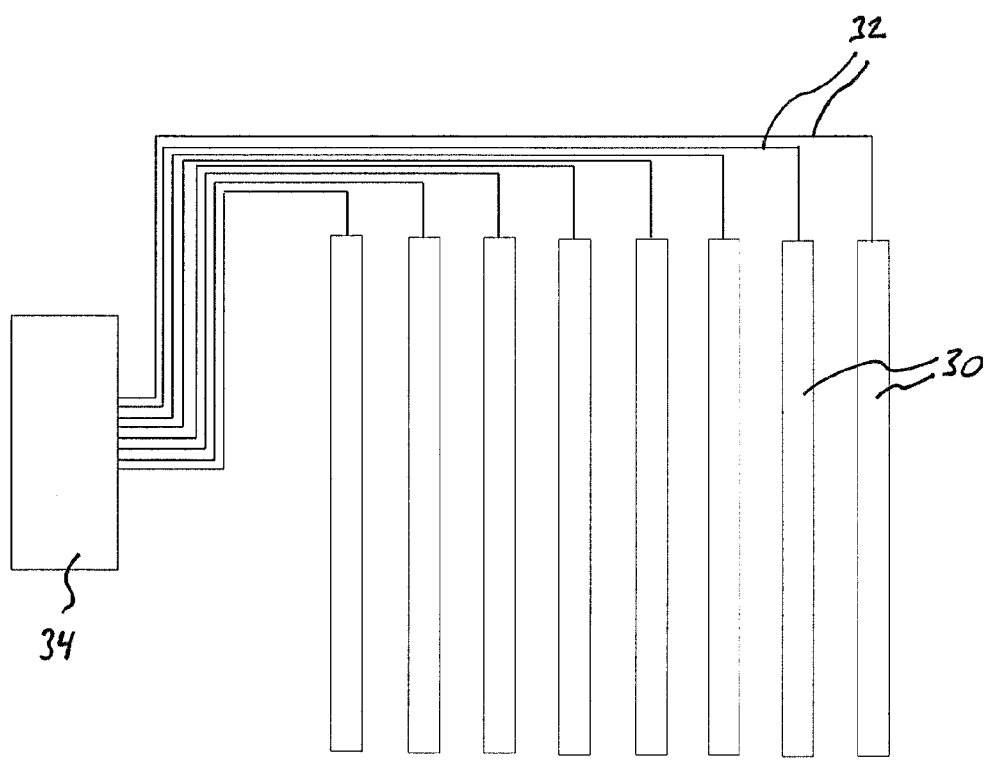
FIG. 2 is a diagram showing implementation of a first embodiment of the present invention that shows modified paths for drive and sense electrodes on an X and Y touch sensor electrode grid.

FIG. 2 is a top schematic view of electrodes as they may be disposed on a substrate in the prior art. In this figure, the electrodes 30 may be considered to be equidistantly spaced apart. The actual number and size of the electrodes 30 is not relevant and may vary without affecting the principles of the present invention. Coupled to each of the electrodes 30 is a routing trace 32. The routing traces 32 connect each of the electrodes 30 to touch sensor circuitry 34. The touch sensor circuitry 34 may include driving or sensing circuits depending on if the electrodes 30 are functioning as drive or sense electrodes. The actual path or shape of the routing traces 32 is not limited to the example shown. The figure is for illustration purposes only in order to teach the concepts of the present invention.

There are several features of the routing traces 32 that will be noted. First, the routing traces 32 may be comprised of a plurality of straight lengths. In this embodiment, the routing traces 32 may make turns, but the routing traces are straight between the turns.

Second, the routing traces 32 have no overshoots or stubs. An overshoot or stub is a relatively small continuation of a trace that is essentially a dead end. Thus an overshoot will result in a turn or branch of the routing trace 32 being made before reaching the end of the routing trace.

Finally, the spacing between parallel lengths of the routing traces 32 is substantially equidistant. In other words, when the routing traces 32 are running parallel to each other for some distance, the spacing between each of the routing traces 32 may be the same. Any variations that may appear in the figure may be ignored.

Figure 3:
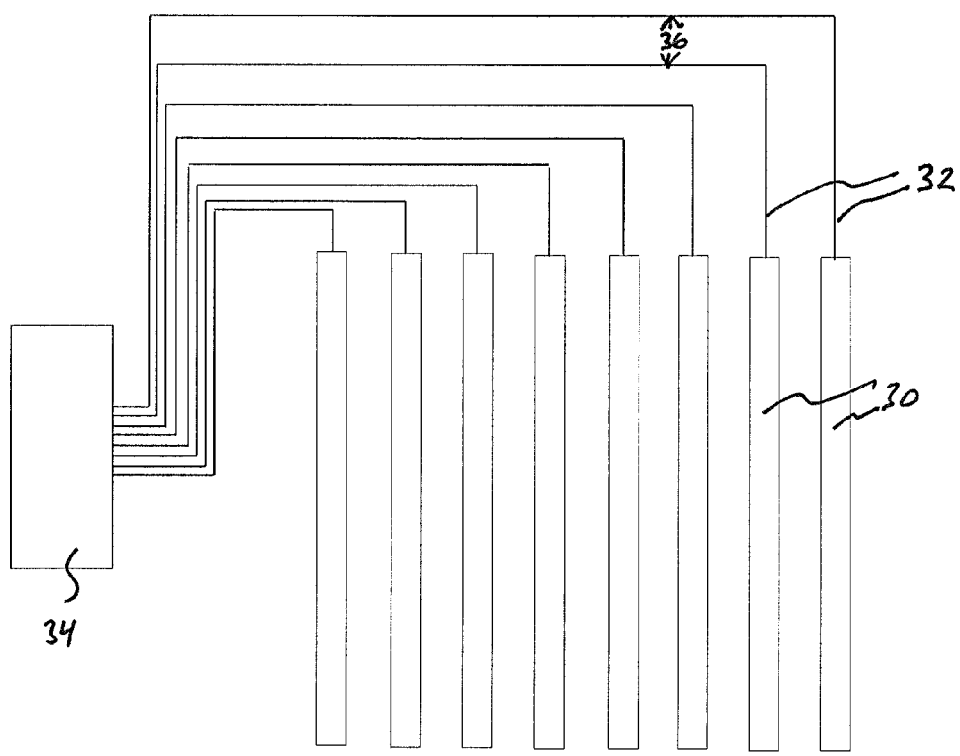
FIG. 3 is a schematic diagram that illustrates a first embodiment wherein the capacitance between any two adjacent electrodes is altered by varying spacing between electrodes to affect the amount of charge and capacitance on the electrodes.

FIG. 3 illustrates a first embodiment of the present invention in that the capacitance between any two adjacent electrodes 30 and routing traces 32 may be made to be similar to any other two adjacent electrodes and routing traces by varying spacing between electrodes. Accordingly, a first embodiment of the present invention is to vary the spacing 36 between the routing traces 32 along at least one portion of a path that connects the touch sensor circuitry 34 to the electrodes 30. The portion of the path where adjustments are made to spacing may be referred to as a shared path. The shared path is where the routing traces 32 are substantially parallel to each other.

In this embodiment, the spacing 36 between routing traces 32 that travel a longer path between the touch sensor circuitry 34 and the electrodes 30 may be made greater than the spacing between routing traces that travel a shorter path. The spacing 36 between the routing traces 32 may be described as graduated as the spacing increases. Thus, where there is a shorter shared path of the routing traces 32, the spacing between them may be smaller than the spacing between routing traces where the shared path is longer. The increase in spacing from the smallest space between routing traces 32 and the largest space between routing traces may be gradual.

It should be understood that while the routing traces are shown as following straight paths, the routing traces may follow a path that is curvilinear or any other desired shape. It should also be understood that the electrodes 30 and the routing traces 32 are both electrodes. The routing traces 32 are simply the portion of the electrode that is not being used as part of an XY grid of a touch sensor. It should also be understood that the electrodes 30 shown are forming at least a portion of the column electrodes of an XY grid of a touch sensor. Another layer of electrodes on a different layer of the touch sensor would form the orthogonal layer of electrodes that are the row electrodes. The principles of the present invention apply to both the column and row electrodes of the touch sensor.

Figure 4:
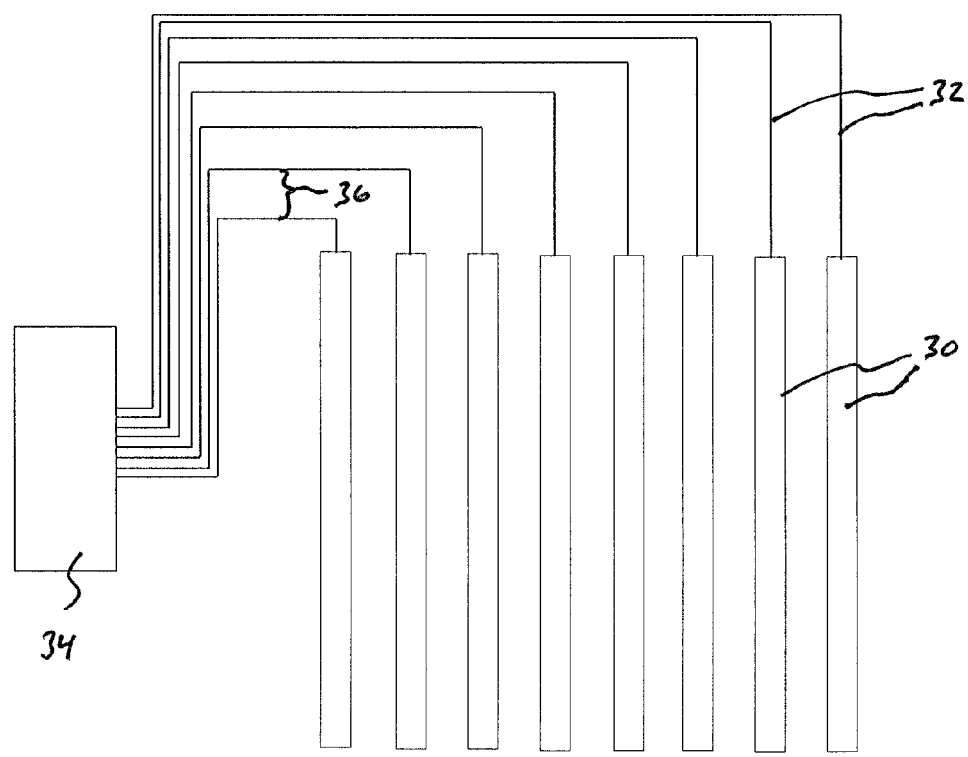
FIG. 4 is a schematic diagram that illustrates another embodiment wherein the spacing between the routing traces is altered to affect the amount of charge and capacitance on the electrodes.

FIG. 4 illustrates another embodiment of the present invention. In this embodiment, the spacing 36 between the routing traces 32 that have a shorter path between the touch sensor circuitry 34 and the electrodes 30 is greater than the spacing between routing traces that travel a longer path. The result of this change would be to increase the imbalance on the electrodes 30. Thus, it is an aspect of the invention to be able to change the charge and thus the capacitance on the routing traces 32, whether it is to increase the imbalance of capacitance as shown in FIG. 4, or to decrease the imbalance as shown in FIG. 3.

Figure 5:
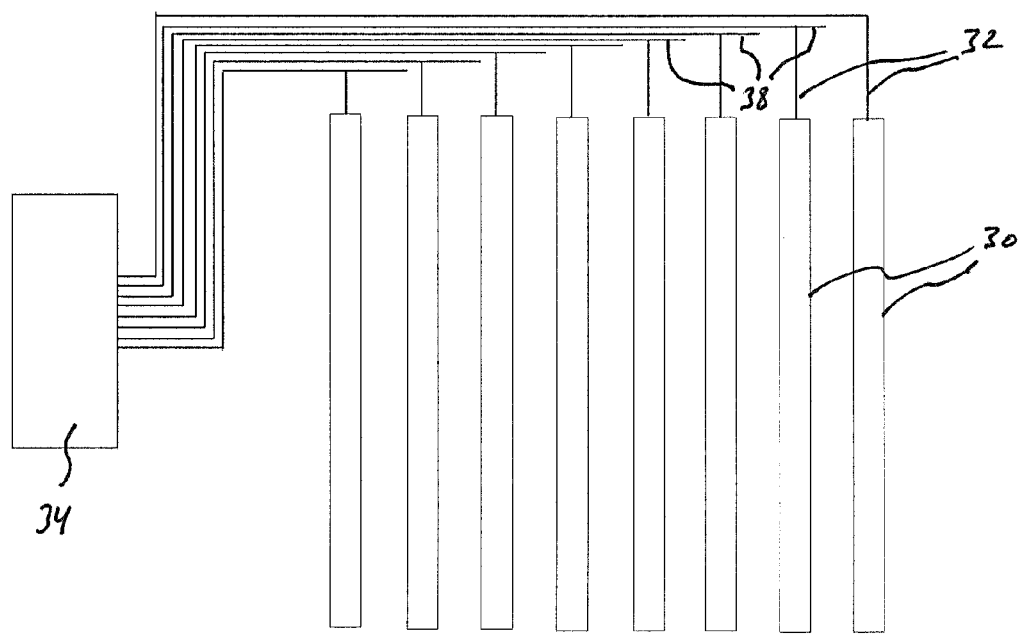
FIG. 5 is a schematic diagram that illustrates another embodiment wherein one or more routing traces include an overshoot or stub that may affect the amount of charge and capacitance on the electrodes.

FIG. 5 illustrates another embodiment of the present invention. In this embodiment, one or more routing traces 32 include an overshoot 38 or stub that may affect the amount of charge on the electrodes 30, and thus the capacitance. The length of the overshoot 38 may be adjusted for each of the routing traces 32 in order to make fine adjustments to the amount of charge on each of the electrodes 30.

An overshoot 38 may actually be placed at more than one location along a single routing trace 32. Therefore, there may be one or more overshoots 38 disposed on a routing trace 32. However, it is observed that an overshoot 38 may have a greater effect on the charge and capacitance of the electrodes 30 if the overshoot is parallel to a different routing trace 32. Accordingly, the overshoots 38 are most effective when placed on parallel segments of the routing traces 32.

Figure 6:
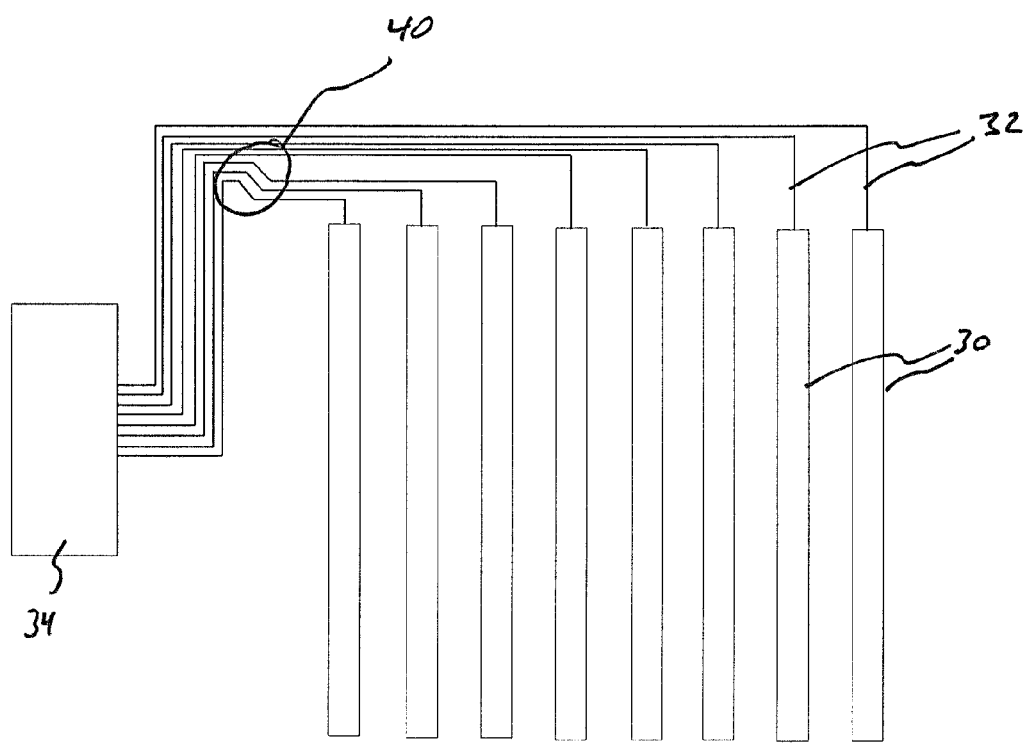
FIG. 6 is a schematic diagram that illustrates another embodiment wherein one or more steps may be inserted along the length of the routing traces to affect the amount of charge and capacitance on the electrodes.

FIG. 6 illustrates another embodiment of the present invention. In this embodiment, one or more steps 40 may be inserted along the length of the routing traces 32. Some routing traces 32 may include a step 40, while others may not in the same design. Furthermore, the steps 40 may be varied in shape and direction of a path. The ultimate purpose of the steps 40 is to change the amount of charge and thus capacitance on the routing traces 32 in order to achieve a balance in capacitance among some or all of the routing traces 32.

It may be an object of the present invention to enable every two adjacent routing traces 32 to have a capacitance that is substantially similar to the capacitance of any other two adjacent routing traces. Likewise, it may be an object of the present invention to enable every two adjacent electrodes 30 to have a capacitance that is substantially similar to the capacitance of any other two adjacent electrodes. The term "substantially similar" may mean that the capacitance of the routing traces 32 or the electrodes 30 is such that no offset needs to be applied. The term may also mean that some relatively small offsets may need to be applied.

A simple method of calculating the relative capacitance Cr between routing traces 32 (which is also applicable to electrodes 30) is with the following formula:

$$Cr = \text{(length of shared route)}/\text{(distance between shared route)}$$

Another aspect of the present invention is related to the concept of balance. There are two types of balance that are relevant to the present invention. The first type of balance may be directed to the balancing of adjacent electrodes when performing mutual capacitance. Mutual capacitance may be defined as the capacitance of two adjacent electrodes relative to each other. In other words, it is the capacitance between them. In contrast, self-capacitance is the capacitance between a single electrode and a reference which is typically going to be ground. When using mutual capacitance for a touch sensor, an object such as a finger that disrupts the mutual capacitance between electrodes causes a decrease in capacitance. In contrast, when using self-capacitance for a touch sensor, an object such as a finger that disrupts the self-capacitance of an electrode to ground causes an increase in capacitance.

The second type of balance may be directed to undesirable parasitic capacitances that may occur between electrodes. The principles of the present invention may be more effective in controlling an imbalance caused by parasitic capacitance versus mutual capacitance.

Figure 7:
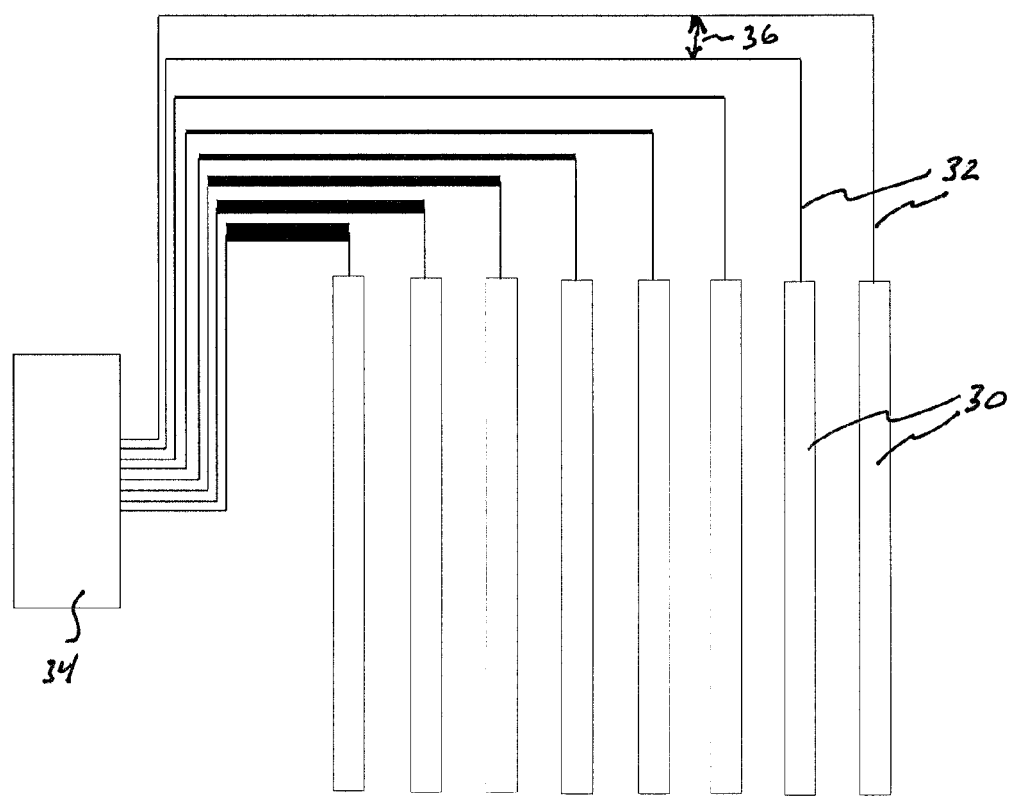
FIG. 7 is a schematic diagram that illustrates another embodiment wherein the thickness of the parallel routing traces 32 is adjusted to affect the amount of charge and capacitance on the electrodes.

FIG. 7 is an illustration of another embodiment of the present invention. In this embodiment, the thickness of the parallel routing traces 32 is adjusted, as well as the spacing 36 between them. It may also be possible to only adjust the thickness of the routing traces 32 while making the spacing between them uniform. Changing the thickness of the shorter routing traces 32 and making them thicker than the longer routing traces may reduce parasitic capacitance.

Figure 8:
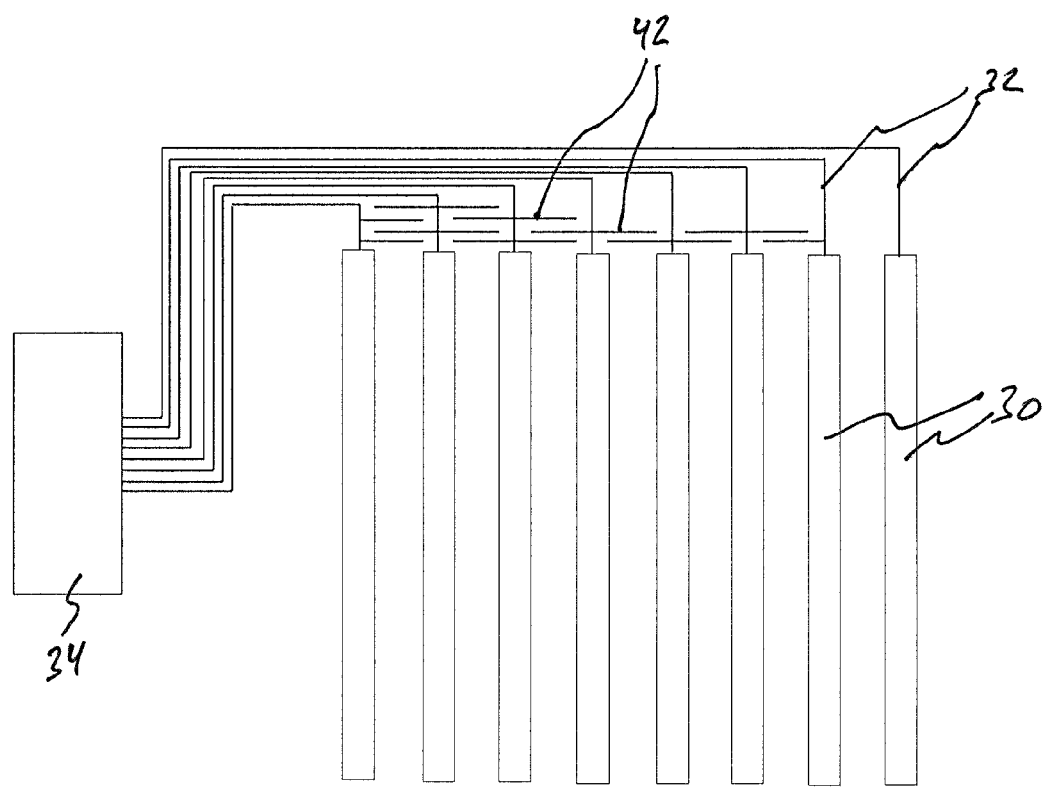
FIG. 8 is a schematic diagram that illustrates another embodiment wherein a plurality of interleaved branches are disposed on at least some of the routing traces to affect the amount of charge and capacitance on the electrodes.

FIG. 8 is an illustration of another embodiment of the present invention. In this embodiment, a plurality of interleaved branches 42 are attached to at least some of the routing traces 32. The number of interleaving routing traces 32 may be adjusted to achieve the desired balance in capacitance on the electrodes 30. Some routing traces 32 may not have any interleaved branches 42, while other routing traces may have multiple interleaved branches. The space between the interleaved branches 42 may be adjusted to achieve the desired capacitance. The length of the interleaved branches 42 may also be varied.

It should be understood that the concepts of using graduated spacing, overshoots, steps, thickness and interleaved branches may be used separately or in any combination with each other in order to achieve the desired balance in capacitance.

In an alternative embodiment of the present invention, the principles of the present invention may be applied to a single-layer touch sensor as well as the multi-layer touch sensor already described. In the single layer touch sensor, the drive and sense electrodes 30 are placed adjacent to each other on the same substrate.

In another alternative embodiment, the features of graduated spacing 36, the use of overshoots 38 and steps 40 may be combined in any combination in order to achieve the desired results of changing the amount of charge and thus capacitance on the routing traces 32 in order to achieve a balance in capacitance without having to use offsets.

In another alternative embodiment, adjustments are made to the routing traces 32 that are not along a shared path. The adjustments may include, but should not be considered to be limited to, spacing between routing traces and overshoots.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method for balancing capacitance on electrodes of a touch sensor, said method comprising:
   1) providing a touch sensor having at least one touch sensor circuit, a plurality of touch sensor electrodes, and a unique routing trace between the at least one touch sensor circuit and each of the plurality of touch sensor electrodes, wherein the routing traces have a shared path along at least a portion of a path between the plurality of touch sensor electrodes and the at least one touch sensor circuit; and
   2) adjusting spacing between the unique routing Traces along the shared path to thereby balance capacitance on the plurality of touch sensors electrodes.

2. The method as defined in claim 1 wherein the method is further comprised of making a space between routing traces smaller for routing traces that have a shorter shared path, and making the space larger for routing traces that have a longer shared path.

3. The method as defined in claim 1 wherein the method is further comprised of providing at least one overshoot on one or more of the routing traces to thereby balance capacitance on the plurality of electrodes.

4. The method as defined in claim 1 wherein the method is further comprised of balancing capacitance on a touch sensor that uses mutual capacitance.

5. A method for balancing capacitance on electrodes of a touch sensor, said method comprising:
  1) providing a touch sensor having at least one touch sensor circuit, a plurality of touch sensor electrodes, and a unique routing trace between the at least one touch sensor circuit and each of the plurality of touch sensor electrodes, wherein the routing traces have a shared path along at least a portion of a path between the plurality of touch sensor electrodes and the at least one touch sensor circuit; and
  2) providing at least one overshoot on one or more of the routing traces to thereby balance capacitance on the plurality of touch sensor electrodes.

6. The method as defined in claim 5 wherein the method is further comprised of adjusting spacing between the unique routing traces along the shared path to thereby balance capacitance on the plurality of touch sensor electrodes.

7. The method as defined in claim 6 wherein the method is further comprised of making a space between routing traces smaller for routing traces that have a shorter shared path, and making the space larger for routing traces that have a longer shared path.

8. The method as defined in claim 5 wherein the method is further comprised of balancing capacitance on a touch sensor that uses mutual capacitance.

9. A system of wiring paths for balancing capacitance on electrodes of a touch sensor, said system comprising:
  at least one touch sensor circuit;
  a plurality of touch sensor electrodes; and
  a unique routing trace between the at least one touch sensor circuit and each of the plurality of touch sensor electrodes, wherein the routing traces have a shared path along at least a portion of a path between the plurality of touch sensor electrodes and the at least one touch sensor circuit, wherein spacing between the unique routing traces along the shared path is adjusted to thereby balance capacitance on the plurality of touch sensor electrodes.

10. The system of wiring paths as defined in claim 9 wherein the system is further comprised of smaller spaces between routing traces that have a shorter shared path, and larger spaces between routing traces that have a longer shared path.

11. The system as defined in claim 9 wherein the system is further comprised of at least one overshoot disposed on one or more of the routing traces to thereby balance capacitance on the plurality of electrodes.

12. The system as defined in claim 9 wherein the system is further comprised of using mutual capacitance between the plurality of touch sensor electrodes.

13. A system of wiring paths for balancing capacitance on electrodes of a touch sensor, said system comprising:
  at least one touch sensor circuit;
  a plurality of touch sensor electrodes; and
  a unique routing trace between the at least one touch sensor circuit and each of the plurality of touch sensor electrodes, wherein the routing traces have a shared path along at least a portion of a path between the plurality of touch sensor electrodes and the at least one touch sensor circuit, wherein at least one overshoot is disposed on one or more of the routing traces to thereby balance capacitance on the plurality of touch sensor electrodes.

14. The system of wiring paths as defined in claim 13 wherein the system is further comprised of adjusting spacing between the unique routing traces along the shared path to thereby balance capacitance on the plurality of electrodes.

15. The system of wiring paths as defined in claim 13 wherein the system is further comprised of smaller spaces between routing traces that have a shorter shared path, and larger spaces between routing traces that have a longer shared path.

* * * * *